United States Patent
Noda

(10) Patent No.: US 8,710,919 B2
(45) Date of Patent: Apr. 29, 2014

(54) DATA PROCESSING METHOD

(75) Inventor: Akira Noda, Kyoto (JP)

(73) Assignee: Shimadzu Corporation, Kyoto-Shi (JP)

( * ) Notice: Subject to any disclaimer, the term of this patent is extended or adjusted under 35 U.S.C. 154(b) by 0 days.

(21) Appl. No.: 13/825,523

(22) PCT Filed: Sep. 24, 2010

(86) PCT No.: PCT/JP2010/066581
§ 371 (c)(1),
(2), (4) Date: Mar. 21, 2013

(87) PCT Pub. No.: WO2012/039061
PCT Pub. Date: Mar. 29, 2012

(65) Prior Publication Data
US 2013/0181769 A1      Jul. 18, 2013

(51) Int. Cl.
*H03K 5/00* (2006.01)
(52) U.S. Cl.
USPC .......................................... 327/551; 327/552
(58) Field of Classification Search
USPC ........................................... 327/551–559, 34
See application file for complete search history.

(56) References Cited

U.S. PATENT DOCUMENTS 6,778,601 B2 *  8/2004  Ise et al. .................. 375/232
8,122,076 B2 *  2/2012  Take ........................ 708/300

FOREIGN PATENT DOCUMENTS

| | | |
|---|---|---|
| JP | 2006340005 A | 12/2006 |
| JP | 2008249694 A | 10/2008 |

OTHER PUBLICATIONS

Japanese language international preliminary report on patentability dated Apr. 16, 2013 and its English language translation issued in corresponding PCT application PCT/JP2010/066581.

\* cited by examiner

*Primary Examiner* — Dinh T. Le
(74) *Attorney, Agent, or Firm* — Bingham McCutchen LLP

(57) ABSTRACT

For an input signal with a ringing superposed thereon, a ringing-generating filter generates an analogous ringing waveform from only a peak portion of the signal which precedes the ringing. A subtractor subtracts the analogous ringing waveform from the input signal to eliminate the ringing. The coefficient of the filter is determined by applying a calculation method similar to a polynomial division based on the complete pivoting Gaussian elimination to polynomials using a reference data expressing a peak waveform and a ringing waveform, and by using a least squares method for minimizing the square of the covariance so as to allow the presence of noise in the data. Furthermore, by a repetitive process on a plurality of the same datasets, the calculation accuracy of the coefficient is improved even under the condition that the ringing frequency is high and the number of samples in one cycle is small.

8 Claims, 3 Drawing Sheets

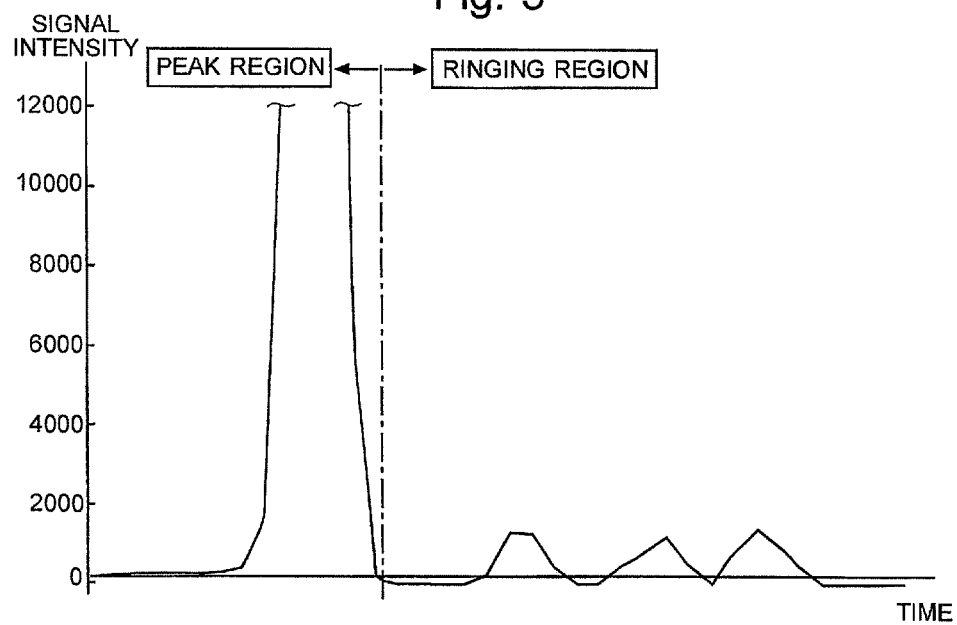
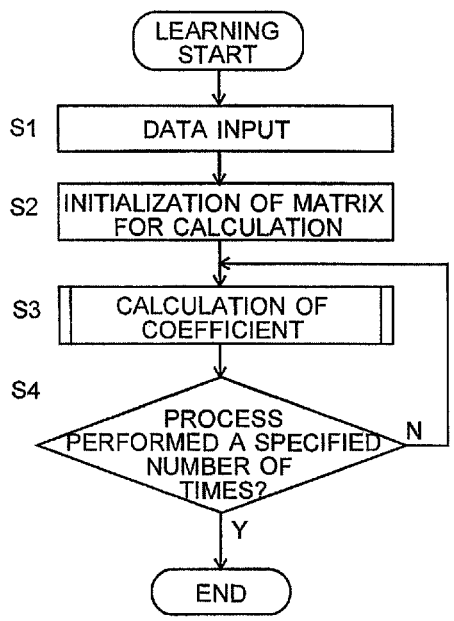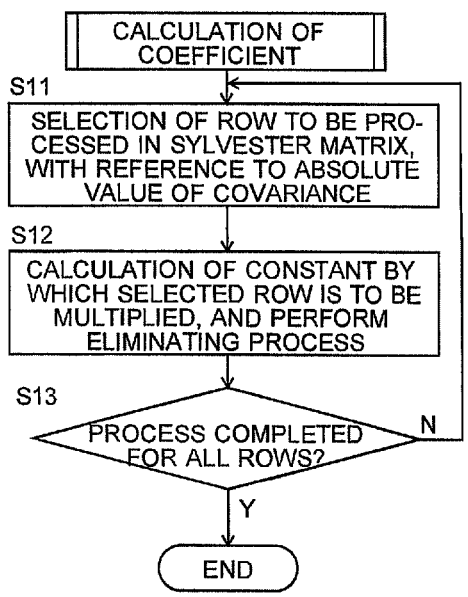

DATA PROCESSING METHOD

TECHNICAL FIELD

The present invention relates to a data processing method and system for eliminating, by digital signal processing, a ringing from a signal in which a peak waveform is accompanied by the ringing. For example, the data processing method and system according to the present invention is suitable for the elimination of a ringing which occurs on a detection signal obtained with an ion detector used in a time-of-flight mass spectrometer (TOF-MS).

BACKGROUND ART

In a time-of-flight mass spectrometer (TOF-MS), ions separated by a time-of-flight mass analyzer according to their mass-to-charge ratios m/z arrive at an ion detector, whereupon the ion detector produces a detection signal having a peak whose intensity corresponds to the number of ions which have arrived at the detector. A data processing system for a TOF-MS processes this detection signal to create a time-of-flight spectrum with the abscissa showing time and the ordinate showing signal intensity, and converts the time of flight into mass-to-charge ratio to create a mass spectrum. To obtain a correct mass spectrum, and to avoid selecting an inappropriate peak when automatically selecting a precursor ion based on the mass spectrum and performing an MS$^n$ analysis, it is desirable that the data processing system should eliminate the largest possible portion of the noise components, which occur due to various factors and overlap the detection signal, before the creation of the time-of-flight mass spectrum.

Normally, the intensity (amplitude) of the ringing component accompanying an objective peak is adequately lower than the signal intensity of the objective peak and continues for only a short period of time. Taking this into account, in a mass spectrometric data processing system disclosed in Patent Document 1, a simple method has been proposed in which a certain threshold for removing noise components is set for the detection signal and any signal value lower than the threshold is replaced with a predetermined value (e.g. a value on the baseline) to eliminate noises inclusive of the ringing.

This method can be used without problem if all the signal peaks have adequately high intensities. However, if a peak with low signal intensity is mixed, it is difficult to set a threshold which correctly distinguishes between the noise and the peak. An incorrect setting of the threshold may possibly eliminate a peak with low signal intensity, or conversely, allow a relatively high-intensity ringing which accompanies a peak with high signal intensity to remain. In recent years, an analysis of substances with extremely low concentrations has been increasingly important in the field of mass spectrometry, and the aforementioned ringing elimination method, which lowers the analyzing sensitivity or signal-to-noise ratio, is not so appropriate. Furthermore, in the case of using multiply-charged ions for the measurement of high-molecular compounds, the period of time from one peak to the next is so short that the next peak is most likely to overlap the period of ringing.

Unlike the simple aforementioned procedure, a method disclosed in Patent Document 2 uses a more complex process to analytically deduce the waveform of a ringing in an input signal and eliminate the ringing. A more detailed description of the process disclosed in the aforementioned document is as follows: An input signal is subjected to an up-sampling process. The resultant signal is divided into higher and lower frequency components, and the peak value of the higher-frequency component is determined. From this peak value and the fluctuation of the lower-frequency signal at the point of occurrence of the peak value, a coefficient corresponding to the amount of ringing is determined. From this coefficient and the higher-frequency component of the input signal, the ringing waveform is deduced.

However, in the ringing elimination method described in Patent Document 2, the deduction accuracy of the ringing waveform is not very high under some conditions, e.g. when the S/N ratio of the signal during the time region where the ringing is present is low, or when the frequency of the ringing is relatively high with respect to the sampling frequency for the analogue-to-digital conversion of the signal and the number of sample points in one cycle of the ringing waveform is small (e.g. five to ten points). Therefore, this method is not suitable for eliminating the ringing in a TOF-MS or similar mass spectrometer which has a high mass-resolving power and is often operated under the aforementioned disadvantageous conditions.

BACKGROUND ART DOCUMENT

Patent Document

Patent Document 1: JP-A 2008-249694
Patent Document 2: JP-A 2006-340005

SUMMARY OF THE INVENTION

Problem to be Solved by the Invention

The present invention has been developed to solve the aforementioned problem, and its objective is to provide a data processing method and system capable of correctly eliminating a ringing which accompanies a peak, even if the number of sample points in one cycle of the waveform of the ringing is small, regardless of the magnitude of the signal intensity of the peak. More specifically, its primary objective is to provide a data processing method and system capable of correctly eliminating a high-frequency ringing which occurs on a detection signal produced by an ion detector in a time-of-flight mass spectrometer.

Means for Solving the Problems

A first aspect of the present invention aimed at solving the aforementioned problem is a data processing method for performing a process of eliminating a ringing from a signal containing the ringing in a peak waveform, including:

a) a ringing-generating step, in which the aforementioned signal is inputted to a ringing-generating filter to generate, by this filter, an analogous waveform of the ringing superposed on the input signal;

b) a subtracting step, in which the analogous waveform of the ringing generated in the ringing-generating step is subtracted from the aforementioned signal to obtain a signal with a reduced magnitude of the ringing; and c) a filter-coefficient determining step, in which, under a condition that a reference signal which can be regarded as having no other peak in a period of ringing subsequent to an occurrence of a peak waveform is inputted to the ringing-generating filter, the time region of the reference signal is divided into a peak region including a peak and a ringing region including no peak, and a filter coefficient of the ringing-generating filter is determined according to a learning algorithm for minimizing the covariance of a peak signal in the peak region and a ringing signal in the ringing region.

A second aspect of the present invention aimed at solving the aforementioned problem is a data processing system for performing a process of eliminating a ringing from a signal containing the ringing in a peak waveform, including:

a) a ringing-generating filter for receiving the aforementioned signal as input and generating an analogous waveform of the ringing superposed on the input signal;

b) a subtracting element for subtracting the analogous waveform of the ringing from the aforementioned signal to obtain a signal with a reduced magnitude of the ringing; and c) a filter-coefficient determiner, which, under a condition that a reference signal which can be regarded as having no other peak in a period of ringing subsequent to an occurrence of a peak waveform is inputted to the ringing-generating filter in place of the aforementioned signal, divides the time region of the reference signal into a peak region including a peak and a ringing region including no peak, and determines a filter coefficient of the ringing-generating filter according to a learning algorithm for minimizing the covariance of a peak signal in the peak region and a ringing signal in the ringing region.

The phrase "which can be regarded as having no other peak in a period of ringing subsequent to an occurrence of a peak waveform" means that, even if there is any peak in a period of the ringing after an occurrence of a peak waveform, the peak is always at the level of an acceptable error or even lower.

In the data processing method and system according the present invention, the filter coefficient of the ringing-generating filter for generating an analogous waveform of the ringing accompanying a peak waveform is not determined in real time based on an input signal, but is determined beforehand according to a learning algorithm in the filter-coefficient determining step or by the filter-coefficient determiner. The "learning" in the present invention means a process of determining a filter-coefficient which optimizes the evaluation function according to the input signal. The learning process may include either only one computing operation for each input signal or a plurality of times of computing operations performed for each input signal.

When the data processing method or system according the present invention is used to process data obtained with a detector of a time-of-flight mass spectrometer or other types of mass spectrometers, the aforementioned reference signal may be a signal produced by the detector in an actual mass spectrometry performed for a standard sample containing reference materials selected so that the ringing region has little or no overlap with a peak originating from another substance.

The reference signal obtained with the detector in the previously described manner can be fed to the analogue-to-digital converter of an actual system, to be converted into a data stream. This stream can be divided into a peak region and a ringing region to obtain a dataset of a peak waveform which corresponds to a peak signal and a dataset of a ringing waveform which corresponds to a ringing signal. Although the filter-coefficient learning process can be performed with one pair of the two kinds of datasets, it is preferable to use two or more pairs of datasets based on different reference signals, or based on the signals obtained by actual measurements using different kinds of reference materials. The use of a plurality of datasets makes the data free from influences of a sub-sampling-time (i.e. smaller than a sampling time) discrepancy in the analogue-to-digital conversion of the signal, as well as influences of various noises other than ringing, thus allowing the filter coefficient to be determined with higher accuracy even if the number of sample points in one cycle of the ringing waveform is small.

As explained earlier, the reference signal can be effectively regarded as a signal in which no other peak is present in the period of ringing subsequent to an occurrence of the peak waveform. Therefore, it is possible to divide the time region of the reference signal into a peak region in which only a peak signal is present and a ringing region in which only a ringing signal is present. In the case of a truly physical model, the observed signal will have a shape created by multiplying an ideal peak by a linear filter having certain characteristics. However, under the condition that the amplitude of the ringing is adequately smaller than the signal amplitude of the preceding peak, the following approximate model can be used:

$$r(t)=f(t)*p(t) \tag{1},$$

where $r(t)$ is the ringing waveform, $p(t)$ is the peak waveform, $f(t)$ is the filter coefficient of the ringing-generating filter, and "*" is a convolution operator. This equation suggests that the filter coefficient $f(t)$ can be determined from datasets expressing the peak waveform $p(t)$ and the ringing waveform $r(t)$ by a learning process.

For example, the learning process of the filter coefficient may include the step of converting the datasets and other information into polynomials by division, Z-conversion or other operations in Fourier space, followed by the step of applying a division method of approximate polynomial described in commonly known literatures, such as Tateaki Sasaki with the title "Kinji Daisuu, Sono Ichi-Kinji Takoushiki No Shisoku Enzan (Approximate Algebra, Part I—Four Arithmetic Operations of Approximate Polynomial)", *RIMS Kokyuroku*, Vol. 920(1995), pp. 115-119, which is available on the Internet. That is to say, the learning process uses an algorithm similar to a polynomial division by the complete Gaussian pivoting elimination, a commonly known method for solving linear equations. In the case of a normal mode of complete Gaussian pivoting elimination using a matrix, when a term for an elimination operation is selected, a row which includes the maximal term among those being processed in the sweeping operation is used, whereas, in the present "similar" method, selected is, for example, a row at which the covariance with a residual vector which expresses the residue elements resulting from division is maximized. Another difference exists in that, in the case of the normal Gaussian elimination, the selected row is multiplied by a constant and added to another row so as to null the column which includes the maximal term, whereas the present method does not stick to the nulling of the column which includes the maximal term; for example, the present method may give priority to the minimization of the square of the covariance of the selected row and a counterpart row so as to allow the presence of noise.

In the signal obtained with the detector of a mass spectrometer, the voltage of the ringing can become lower than the baseline, in which case the data obtained by the analogue-to-digital conversion may have invalid values for the calculation, such as zero or smaller values. If such data are left intact and the division for the filter-coefficient calculation is performed, some portion of the data that should inherently be negative values may be evaluated as an appropriate value including zero, causing an increase in the error of the filter-coefficient calculation. To avoid this problem, the data processing method and system according to the present invention may preferably be configured so that, when a data has been found to be invalid in the calculation process, e.g. when a value obtained by an analogue-to-digital conversion has been found to be negative, the filter-coefficient calculation is skipped, and instead, the calculated result is normalized by the number of data actually used for the calculation.

Although the use of a plurality of datasets in the previously described manner improves the stability of calculation, performing the Gaussian elimination only one time cannot yield an optimal solution; the result will be a mere approximate one. Accordingly, it is preferable to repeat the Gaussian elimination (the "similar" version) a plurality of times so as to make the result closer to the optimal solution.

Effect of The Invention

By the data processing method and system according to the present invention, since the filter coefficient of the ringing-generating filter is determined by a learning process (i.e. by a repetitive process) using a reference signal, the filter coefficient can be determined with high accuracy even if the ringing frequency is high and the number of sample points in one cycle of the ringing waveform is small. Furthermore, since the presence of noise in filter-coefficient calculation is allowed, the filter coefficient can be determined with high accuracy even in the case where the signal-to-noise ratio is not very high. By using such an appropriately calculated filter coefficient in the ringing-generating filter, an analogous waveform of the ringing is generated for an input signal, and this waveform is subtracted from the input signal to eliminate the ringing. Thus, the ringing superposed on the input signal can be appropriately eliminated.

BRIEF DESCRIPTION OF THE DRAWINGS

FIG. 3 is a graph showing one example of the separation of a peak waveform and a ringing waveform by the time region.

FIGS. 4A and 4B are flowcharts showing a process of calculating the filter coefficient.

BEST MODE FOR CARRYING OUT THE INVENTION

One embodiment of the data processing method and system according to the present invention is hereinafter described with reference to the attached drawings.

Figure 2:
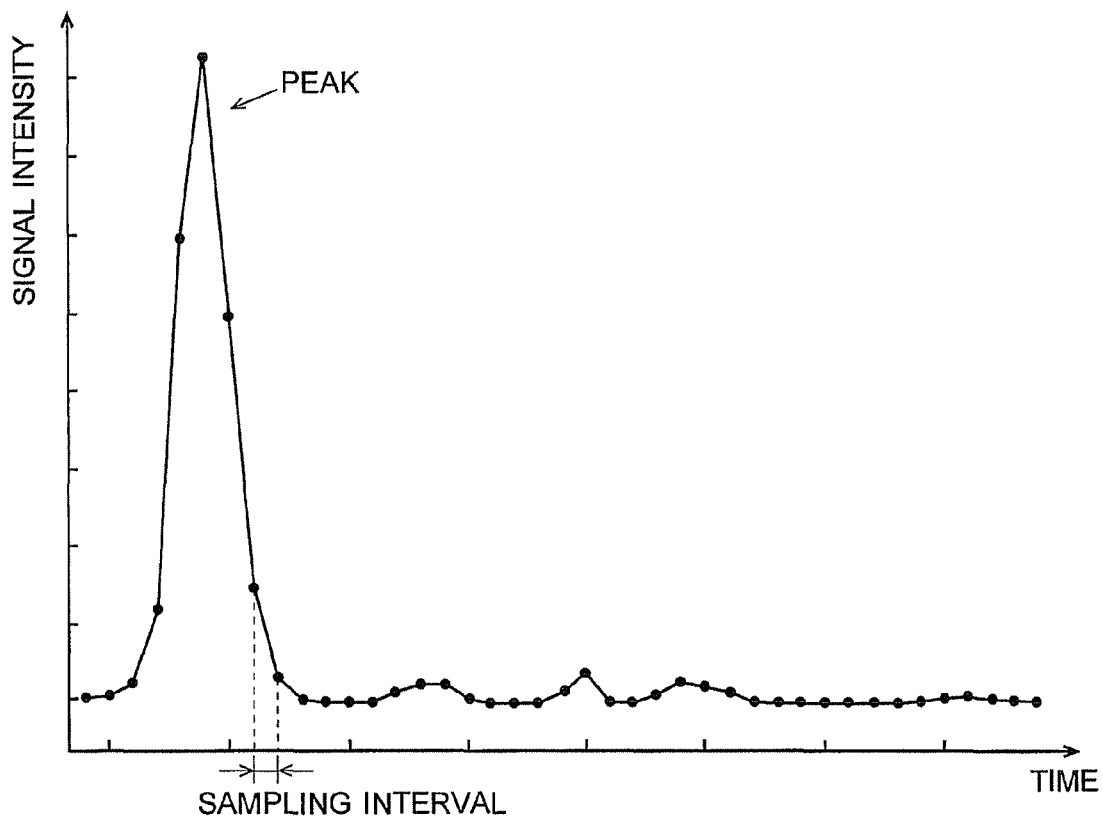
FIG. 2 is a graph showing one example of the peak waveform accompanied by a ringing actually observed in a time-of-flight mass spectrometer.

FIG. 2 is a graph showing one example of the peak waveform accompanied by a ringing actually observed in a time-of-flight mass spectrometer (TOF-MS). This figure demonstrates that a plurality of cycles of ringing waveforms have occurred immediately after the peak waveform which has occurred as a result of an actual incidence of ions onto a detector. To eliminate (or reduce) this ringing waveform as much as possible is the objective of the data processing method and system according to the present invention.

[Analogous Model of Signal and Principle for Ringing Elimination]

In the present ringing elimination method, the time region of a signal consisting of a peak and a thereby induced ringing (FIG. 2) is divided into a peak region and a ringing region, as shown in FIG. 3. As stated earlier, on the assumption that the amplitude of the ringing signal in the ringing region is significantly smaller than that of the peak signal in the preceding peak region, the following analogous model, which has already been presented as equation (1), is considered.

$$r(t)=f(t)*p(t)$$

Since the ringing signal is $r(t)=0$ in the peak region and the peak signal is $p(t)=0$ in the ringing signal, the input signal $s(t)$ can be regarded as $p(t)+r(t)$. A formula obtained by multiplying this input signal $s(t)$ by the filter coefficient $f(t)$ of the ringing-generating filter suggests that, after the peak signal $p(t)$ has been inputted (i.e. the peak region has ended), it is only the ringing waveform that is generated by the computing operation of the ringing-generating filter.

Actually, when the ringing region begins after the peak region is completed, the ringing signal $r(t)$ begins to be inputted to the ringing-generating filter, following the peak signal $p(t)$. Therefore, strictly speaking, a ringing waveform originating from the ringing signal contained in the input signal $s(t)$ is also generated by the ringing-generating filter. However, this ringing waveform originating from the ringing signal contained in the input signal $s(t)$ can be ignored, since the amplitude of the ringing signal is significantly smaller than that of the peak. That is to say, according to the aforementioned analogous model, the ringing waveform can be expressed as $s(t)*f(t)$, and a signal which equals the input signal $s(t)$ minus the ringing can be obtained by computing $s(t)-s(t)*f(t)$.

[Configuration of Data Processing System]

Figure 1:
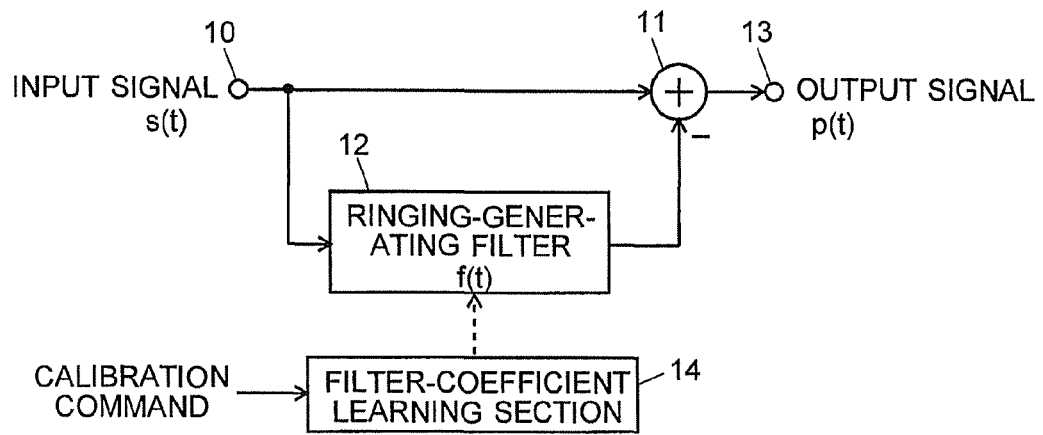
FIG. 1 is a configuration diagram showing the main components of one embodiment of a data processing system for carrying out a data processing method according to the present invention.

Based on the previously described principle for ringing elimination, the data processing system for carrying out the data processing method according to the present invention will have a configuration as schematically shown in FIG. 1.

An input signal $s(t)$ to be processed, which is given through an input terminal 10, is sent to a ringing-generating filter 12 as well as to a subtractor 11. The ringing-generating filter 12, which has a predetermined filter coefficient in a rewritable form, performs an operation on the inputted signal $s(t)$ according to the filter coefficient to generate and output an analogous waveform of the ringing. The subtractor 11 performs the process of subtracting the analogous waveform of the ringing from the input signal $s(t)$ and outputs the resultant signal $p(t)$, with the ringing eliminated, at the output terminal 13. The filter coefficient of the ringing-generating filter 12 is calculated by a filter-coefficient learning section 14 when a calibrating process is performed prior to the input of an actual signal to be processed. The data processor shown in FIG. 1 can be implemented in the form of either a software or hardware system.

[Overview of Method of Calculating Filter Coefficient of Ringing-Generating Filter]

As is evident from the previous descriptions, the method of determining the filter coefficient of the ringing-generating filter 12 is essential for improving the ringing-eliminating performance of the present ringing elimination method. The relationship of equation (1) shows that the filter coefficient $f(t)$ of the ringing-generating filter 12 is determined by a deconvolution using the ringing waveform $r(t)$ and the peak waveform $p(t)$. In a discrete system handled in computers or the like, convolution and deconvolution can be expressed by using four arithmetic operations. Therefore, the filter coefficient can be determined by using division or Z-conversion in Fourier space to create polynomials expressing the relationship between the known ringing waveform $r(t)$ and the peak waveform $p(t)$, with the filter coefficient as an unknown variable, and solving the polynomials by the known division method of approximate polynomial. The division method of approximate polynomial is described in detail in the aforementioned reference ("Kinji Daisuu, Sono Ichi—Kinji Takoushiki No Shisoku Enzan"), and no detailed description will be made in the present description. Basically, it is a solution method which uses the complete pivoting Gaussian elimination to calculate polynomial H for given polynomials F and G under the condition that polynomials F, G and H satisfy the relationship F=GH (provided that the numerical coefficients of polynomial F contain errors, and the upper limit E of those errors is adequately smaller than 1).

In the calculation using the aforementioned division method of approximate polynomial, when a dataset (p, r) of one peak waveform and one ringing waveform is given, it should be possible to calculate the filter coefficient. However, even if the peak waveform is the same, the ringing waveform will not always be the same, since a ringing which accompanies a peak occurs due to various factors, such as a mismatch in the impedance of circuits, lack of frequency bands, or signal reflections. Furthermore, even if the waveforms of the peak and ringing on the analogue level are the same, the data values representing the waveform will change depending on the timing of the sampling in the analogue-to-digital conversion process. Another problem is the superposition of various noises which occurs in actual circuits. For these reasons, to calculate the filter coefficient, it is practically necessary to use two or more (or the largest possible number of) datasets (p1, r1, p2, r2, . . . ,pn, rn) of the peak-and-ringing waveform. The use of a plurality of datasets of the peak-and-ringing waveform is particularly effective in the case where the number of samples constituting the ringing waveform is small (i.e. when the ringing frequency is high).

In the division method of approximate polynomial described in the aforementioned reference, the solution is obtained by performing an eliminating operation on the rows of the matrix one time for each row by the complete Gaussian pivoting elimination. In this ringing elimination method, since a plurality of data must be simultaneously handled, an optimal solution cannot always be obtained by one cycle of operation; actually, the operation must be repeated at least two or three times. Accordingly, in the present method, a repetitive learning process using the division method of approximate polynomial is performed, using a plurality of datasets of the same peak-and-ringing waveform, to improve the accuracy of the filter coefficient.

[Details of Filter-Coefficient Calculation by Learning]

FIGS. 4A and 4B are flowcharts showing the learning process of the ringing-generating filter coefficient.

As explained earlier, the filter-coefficient learning process uses a reference data in which the peak waveform and the ringing waveform are completely separated, as shown in FIG. 3. In the case of using the data processing system of the present embodiment to process data obtained with a mass spectrometer, a set of data obtained by actually performing a mass spectrometry on a certain sample is used as the reference data with which the filter-coefficient learning section 14 calculates the filter coefficient. This calculation will be complex if the ringing region includes a peak originating from another substance. This problem can be avoided by performing a mass spectrometry of a standard sample containing only known substances for which it is guaranteed that no ringing region will include a peak originating from another substance, then converting an analogue signal obtained with the detector into digital data, and acquiring the data into a computer as the reference data. In the case of using a plurality of datasets of the peak-and-ringing waveform in the previously described manner, the mass spectrometry should be performed for each of a plurality of different standard samples.

For example, when the learning of the filter coefficient is performed in response to a calibration command, a set of data prepared in the previously described manner is loaded into the filter-coefficient learning section 14 (Step S1). In the present example, an algorithm similar to a polynomial division by the complete Gaussian pivoting elimination, which is based on the division method of approximate polynomial as disclosed in the aforementioned reference, is used to calculate the filter coefficient. Now, let the matrix for filter-coefficient calculation be defined as follows:

$$\begin{pmatrix} E & P' \\ R & M \end{pmatrix} P' = \begin{pmatrix} P(t) & \cdots & & 0 & 0 & 0 \\ \cdots & \cdots & & \cdots & \cdots & \cdots \\ 0 & 0 & & P(t) & \cdots & 0 \\ \cdots & \cdots & & \cdots & \cdots & \cdots \\ 0 & 0 & & 0 & \cdots & P(t) \end{pmatrix} \quad (2)$$

where P' is a Sylvester matrix (whose initial value is a matrix in which a staircase peak waveforms P(t) are diagonally held), E is an adjoint (whose initial value is a unit matrix), M is a residual vector (whose initial value is a ringing waveform), and R is a result vector. This is an extended version of the division method of approximate polynomial in which the elements of the Sylvester matrix and the residual vector are extended from scalars to vectors. After the data are inputted in Step S1, the matrix for the filter-coefficient calculation is initialized, based on the input data (Step S2). Subsequently, a calculation for computing the filter coefficient, i.e. an operation on the matrix, is carried out (Step S3).

In the normal mode of complete pivoting Gaussian elimination, when a term for an elimination operation is selected, the row which includes the maximal term among those being processed in the sweeping operation is used. By contrast, in the present method, a row at which the square (or alternatively, the absolute value) of the covariance with the residual vector is maximized is selected. As described previously, if there are a plurality of datasets, the elements of both the residual vector M and the Sylvester matrix P' will not be scalars but vectors, in which case the sum of the square of the covariance with each element of the residual vector M is calculated, and the row at which the sum is maximized is located (Step S11).

It should be noted that, in a detection signal of a mass spectrometer, the ringing can indicate a voltage level of lower than the baseline. In this case, if this signal is inputted to an analogue-to-digital converter, the output may have an invalid value equal to or smaller than zero. If such data are left intact and directly used in the filter-coefficient calculation, that portion of data which should inherently have negative values will be evaluated as zero or an appropriate clip value, causing an error of the filter coefficient. To avoid this problem, when an invalid data resulting from the aforementioned reason has been found among the elements of the matrices in the calculation process, the data can be ignored; i.e. the data may be simply skipped in the calculation. Naturally, in such a case, the covariance should be normalized by the number of actually used data.

The operation of selecting the row at which the covariance (or the sum of the covariance) with the residual vector M is maximized is aimed at minimizing the cancellation of digits in the calculating process described in the aforementioned reference. Accordingly, any row-selecting method different from the previously described one may be used as long as the number of digits of calculation falls within the acceptable range.

When one row is selected, an eliminating process is performed by an operation using the other rows (Step S12). In the normal mode of Gaussian elimination, the selected row is multiplied by a constant and added to another Sylvester matrix and the residual vector so as to null the column which includes the maximal term. However, in the case where the ringing-waveform data contains a highly random noise, although the calculation of nulling the column which includes the maximal term can be approximately solved by minimizing the square norm, this method has the problem that it creates a filter coefficient which makes the noise concentrated into a specific period of time. To avoid this problem and improve the stability of calculation, the eliminating process in the present example is designed so as not to forcibly null the column concerned but allow some noises to be present in the data.

This can be achieved by using the fact that noises and peaks are uncorrelated. More specifically, in the calculation of multiplying the selected row by a constant and subtracting it from the counterpart row, the constant can be determined so as to make the counterpart row uncorrelated to the selected row. For this calculation, the least squares method for minimizing the square of the covariance can be used. This problem can be analytically solved and expressed as the following equation (3):

$$\alpha = \frac{\sum_n SS_n RS_n}{\sum_n RS_n RS_n} \quad (3)$$

where SSn is the autocovarians of the selected row computed for the n-th element of each element vector, and similarly, RSn is the covariance of the selected row and the counterpart row computed for the n-th element of each element vector. As in the case of the row selection, if an invalid data has been found in the calculation process, that data is ignored and the result is normalized by the number of actually used data.

The processes of Steps S11 and S12 need to be performed one time for each row of the Sylvester matrix. Accordingly, after the process in Step S12 is completed, it is determined whether the processes have been completed for all the rows (Step S13). If any row remains unprocessed, the operation returns to Step S11 to continue the previously described processes. After the processes have been performed one time for each and every row, the operation proceeds from Step S3 to Step S4 to determine whether the coefficient-calculating process in Step S3 has been performed a specified number of times.

As explained earlier, in the present method, since a plurality of data must be simultaneously handled, an optimal solution cannot always be obtained by performing the previously described operation only one time for each row. For this reason, the number of repetitions is specified beforehand, and the coefficient-calculating process using the same dataset is repeated to improve the accuracy of the coefficient. Increasing the number of repetitions of the computation brings the solution gradually closer to the optimal solution. The number of repetitions of the computation can be appropriately determined from the desired accuracy of the solution and the allowable computing time. Alternatively, it is possible to repeat the computation until a specified period of time is elapsed, without specifying the number of repetitions. A study by the present inventor has demonstrated that, in most cases, repeating the computation only two or three times is sufficient to achieve an adequately. high accuracy.

In the previous embodiment, the eliminating process is sequentially performed for each row of the matrix shown in equation (2). It is also possible to perform a process on all the rows simultaneously, as in the so-called "hill-climbing method", using the value of $\alpha$ calculated by equation (3), or more simply, using the covariance of each row of the Sylvester matrix and the residual vector. In this case, although the computing time will be longer than in the case of sequentially performing the process for each row, a merit exists in that the filter coefficient to be eventually obtained is less likely to contain high-frequency components. Superposition of some amount of high-frequency components can normally be ignored, since high-frequency components contained in the filter coefficient are eliminated by the operation of superposing the filter coefficient and the peak signal in the process of generating the ringing waveform. However, in some cases, e.g. if the number of digits for the calculation in the ringing-eliminating process is extremely limited, eliminating the largest possible amount of high-frequency components is effective for preventing unnecessary use of the number of digits of calculation due to the presence of high-frequency components.

[Elimination or Ringing by Ringing-Generating Filter]

The filter coefficient of the ringing-generating filter 12 computed by the previously described learning algorithm determines the characteristics of the ringing-generating filter 12. In the data processing system shown in FIG. 1, a ringing waveform for the input signal s(t) is generated by the ringing-generating filter 12, and the resultant waveform is subtracted from the input signal s(t) by the subtractor 11, whereby the ringing superposed on the input signal s(t) is eliminated. As for the invalid portion, or clipped portion, of the data, an appropriate process (e.g. an insertion of zeros) is concurrently performed.

Figure 5:
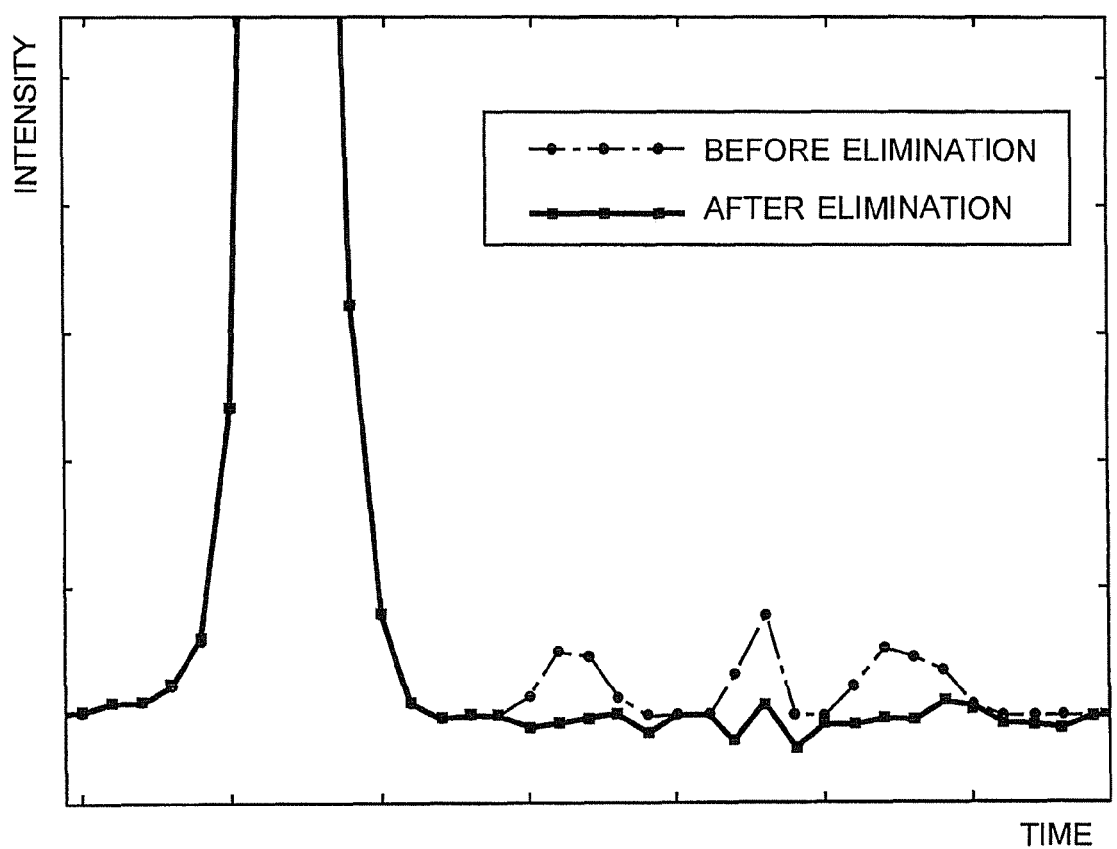
FIG. 5 is a graph showing a ringing-eliminating effect obtained by a data processing method according to the present invention.

FIG. 5 is a graph showing one example of the effect obtained by performing the previously described ringing-eliminating process. As already noted, even if the peak waveform is the same, the ringing waveform is not always the same but will fluctuate to some extent. Therefore, in principle, a minor residual signal remains even after the ringing-eliminating process is performed. However, as shown in the figure, the amplitude of the ringing is significantly reduced as compared to the originally observed ringing.

It should be noted that the previously described embodiment is a mere example of the present invention, and any change, modification or addition appropriately made within the spirit of the present invention will evidently fall within the scope of claims of this patent application.

Explanation of Numerals

10 . . . Input Terminal
11 . . . Subtractor
12 . . . Ringing-Generating Filter
13 . . . Output Terminal
14 . . . Filter-Coefficient Learning Section 14

The invention claimed is:

1. A data processing method for performing a process of eliminating ringing from a signal containing the ringing in a peak waveform, comprising:

a filter-coefficient determining step, wherein a reference signal, which is divided into a peak region including a peak and a ringing region including no peaks higher than an acceptable error level, is inputted to a filter-coefficient learning section to determine a filter coefficient according to a learning algorithm for minimizing a covariance of a peak signal in the peak region and a ringing signal in the ringing region;

a ringing-generating step, wherein a signal, which contains a peak waveform and ringing, is inputted to the ringing-generating filter that uses the filter coefficient previously determined to generate an analogous waveform of the ringing superposed on the signal; and a subtracting step, in which the analogous waveform of the ringing generated in the ringing-generating step, is subtracted from the signal to obtain a processed signal with a reduced magnitude of the ringing.

2. A data processing system for performing a process of eliminating a ringing from a signal containing the ringing in a peak waveform, comprising:

a filter-coefficient determiner, wherein the determiner has a reference signal inputted to the ringing-generating filter, divides the reference signal into a peak region including a peak and a ringing region including ringing whose peaks are at error levels or lower, and determines a filter coefficient for the ringing-generating filter according to a learning algorithm for minimizing a covariance of a peak signal in the peak region and a ringing signal in the ringing region;

a ringing-generating filter for receiving a signal, which contains a peak waveform and ringing, and using the filter coefficient previously determined to generate an analogous waveform of the ringing superposed on the signal;

a subtracting element for subtracting the analogous waveform of the ringing from the aforementioned signal to obtain a processed signal with a reduced magnitude of the ringing.

3. The data processing system according to claim 2, wherein: when the ringing signal has a negative value, the filter-coefficient determiner regards that portion of the signal as invalid data and skips the calculation of the covariance, and normalizes a calculated result by the number of actually used data.

4. A data processing method for eliminating ringing, comprising:

a filter-coefficient determining step, wherein a reference signal is inputted to a ringing-generating filter, the reference signal is divided into a peak region having a peak and a ringing region having ringing whose peaks are at error levels or lower, and a filter coefficient is determined from the reference signal according to a learning algorithm for minimizing a covariance of a peak signal in the peak region and a ringing signal in the ringing region;

a ringing-generating step, wherein a signal, which contains a peak waveform and ringing, is inputted to the ringing-generating filter that uses the filter coefficient previously determined to generate an analogous waveform of the ringing superposed on the signal; and a subtracting step, in which the analogous waveform of the ringing generated in the ringing-generating step is subtracted from the signal to obtain a processed signal with a reduced magnitude of the ringing.

5. A data processing system for eliminating ringing, comprising:

a filter-coefficient determiner, wherein the determiner has a reference signal entered into the ringing-generating filter, divides the reference signal into a peak region including a peak and a ringing region including ringing whose peaks are at error levels or lower, and determines a filter coefficient of the ringing-generating filter according to a learning algorithm for minimizing a covariance of a peak signal in the peak region and a ringing signal in the ringing region;

a ringing-generating filter for receiving a signal, which contains a peak waveform and ringing, and using the filter coefficient previously determined to generate an analogous waveform of the ringing superposed on the signal; and a subtracting element for subtracting the analogous waveform of the ringing from the signal to obtain a processed signal with a reduced magnitude of the ringing.

6. The data processing system according to claim 5, wherein, when the ringing signal has a negative value, the filter-coefficient determiner regards that portion of the signal as invalid data and skips the calculation of the covariance, and normalizes a calculated result by the number of actually used data.

7. A data processing method according to 4, wherein the reference signal is produced by a detector in a mass spectrometry by using a standard sample containing reference materials selected so that the ringing region has little or no overlap with a peak originating from another substance.

8. A data processing system according to 5, wherein the reference signal is produced by a detector in a mass spectrometry by using a standard sample containing reference materials selected so that the ringing region has little or no overlap with a peak originating from another substance.

\* \* \* \* \*

UNITED STATES PATENT AND TRADEMARK OFFICE
CERTIFICATE OF CORRECTION

PATENT NO.        : 8,710,919 B2                                       Page 1 of 1
APPLICATION NO.   : 13/825523
DATED             : April 29, 2014
INVENTOR(S)       : Akira Noda It is certified that error appears in the above-identified patent and that said Letters Patent is hereby corrected as shown below:

Title Page

Item (54) Title

"DATA PROCESSING METHOD" should read "DATA PROCESSING METHOD AND SYSTEM."

Signed and Sealed this
Twenty-seventh Day of October, 2015

Michelle K. Lee
*Director of the United States Patent and Trademark Office*

UNITED STATES PATENT AND TRADEMARK OFFICE
CERTIFICATE OF CORRECTION

Page 1 of 1

PATENT NO. : 8,710,919 B2
APPLICATION NO. : 13/825523
DATED : April 29, 2014
INVENTOR(S) : Akira Noda It is certified that error appears in the above-identified patent and that said Letters Patent is hereby corrected as shown below:

On the Title Page, Item (54) and in the Specification, Column 1, Line 1, Title

"DATA PROCESSING METHOD" should read "DATA PROCESSING METHOD AND SYSTEM."

This certificate supersedes the Certificate of Correction issued September 23, 2015.

Signed and Sealed this
Fifth Day of January, 2016

Michelle K. Lee
*Director of the United States Patent and Trademark Office*